(12) United States Patent
Kang et al.

(10) Patent No.: US 7,817,198 B2
(45) Date of Patent: Oct. 19, 2010

(54) ACTIVE PIXEL ARRAY OF CMOS IMAGE SENSOR

(75) Inventors: Shin Jae Kang, Gunpo (KR); Won Tae Choi, Yongin (KR); Joo Yul Ko, Pyeongtaek (KR); Deuk Hee Park, Seoul (KR)

(73) Assignee: Samsung Electro-Mechanics Co., Ltd, Gyunggi-do (KR)

( * ) Notice: Subject to any disclaimer, the term of this patent is extended or adjusted under 35 U.S.C. 154(b) by 1164 days.

(21) Appl. No.: 11/423,666

(22) Filed: Jun. 12, 2006

(65) Prior Publication Data

US 2007/0030370 A1    Feb. 8, 2007

(30) Foreign Application Priority Data

Aug. 2, 2005 (KR) .................. 10-2005-0070557
Mar. 29, 2006 (KR) .................. 10-2006-0028629

(51) Int. Cl.
*H04N 3/14* (2006.01)
*H04N 5/335* (2006.01)
*H04N 9/04* (2006.01)

(52) U.S. Cl. ............... 348/308; 348/272; 348/273

(58) Field of Classification Search ......... 348/302–310, 348/266–283; 257/213–413
See application file for complete search history.

(56) References Cited

U.S. PATENT DOCUMENTS

| | | | |
|---|---|---|---|
| 6,632,701 B2* | 10/2003 | Merrill | 438/70 |
| 7,129,466 B2* | 10/2006 | Iwasaki | 250/214.1 |
| 7,145,599 B2* | 12/2006 | Takeda | 348/247 |
| 7,215,368 B2* | 5/2007 | Inoue | 348/273 |
| 7,218,347 B2* | 5/2007 | Shinohara | 348/272 |
| 7,382,408 B2* | 6/2008 | Rossi | 348/308 |
| 7,420,607 B2* | 9/2008 | Ota et al. | 348/315 |
| 7,477,304 B2* | 1/2009 | Hu | 348/272 |

FOREIGN PATENT DOCUMENTS

| | | |
|---|---|---|
| JP | 07-099420 A | 4/1995 |
| JP | 2002-290199 A | 10/2002 |
| KR | 1020040036087 A | 4/2004 |
| WO | 2004/075299 A1 | 9/2004 |

* cited by examiner

*Primary Examiner*—Jason Chan
*Assistant Examiner*—Pritham Prabhakher

(57) ABSTRACT

The present invention relates to an active pixel array of a CMOS image sensor. The active pixel array includes a pixel sensor array in which a pixel sensor which detects first and second light signals, of which the wavelengths are different from each other, among all wavelengths of light signals so as to generate current and voltage signals and a pixel sensor which detects a third light signal with a predetermined wavelength so as to generate a current or voltage signal are alternately arranged; and a color filter array that is formed on the pixel sensor array and in which a filter which transmits all wavelengths of light signals and a filter which transmits the third signal with a predetermined wavelength are alternately arranged.

16 Claims, 7 Drawing Sheets

ACTIVE PIXEL ARRAY OF CMOS IMAGE SENSOR

CROSS-REFERENCE TO RELATED APPLICATIONS

The application claims the benefit of Korea Patent Application No. 2006-0028629 filed with the Korea Industrial Property Office on Mar. 9, 2006, and Korea Patent Application No. 2005-0070557 filed with the Korea Industrial Property Office on Aug. 2, 2005, the disclosures of which are incorporated herein by reference.

BACKGROUND OF THE INVENTION

1. Field of the Invention

The present invention relates to an active pixel array of a CMOS image sensor, in which a color filter array including a filter which transmits all wavelengths of light signals and a double PN junction photodiode are used to simultaneously detect two kinds of light signals, of which the wavelengths are different from each other, in one pixel and to secure a wide light receiving area, so that high resolution, a high signal-to-noise ratio (S/N), and an improved dynamic range can be expected.

2. Description of the Related Art

In a general image sensor, when light enters a photoconductor through a color filter, the electron-holes generated in the photoconductor in accordance with the wavelength and intensity of the light form a signal so as to be output to an output section. The image sensor is divided into a CCD (Charge Coupled Device) image sensor and a CMOS (Complementary Metal Oxide Semiconductor) image sensor.

The CCD image sensor is composed of a photodiode as a receiving section, a charge transmitting section, and a signal output section. The photodiode receives light so as to generate a signal charge, the charge transmitting section transmits the signal charge generated by the photodiode to the signal output section by using a CCD without any loss, and the signal output section stores signal charges and detects a voltage proportional to the amount of signal charges so as to produce an analog output. In the CCD image sensor, since the signal charges are converted into a voltage at the last stage, the noise characteristic is excellent. Accordingly, the CCD image sensor is used in a high-definition digital camera, camcorder or the like. In the CCD image sensor, however, a large voltage is required because of a complicated driving method thereof, and power consumption is large because a separate driving circuit is needed. Further, a signal processing circuit cannot be implemented within a CCD chip because the number of mask processes is large. Accordingly, in order to overcome such drawbacks, the development of a submicron CMOS image sensor is being actively performed.

Different from the CCD image sensor, a CMOS image sensor converts signal charges generated by each photodiode into a voltage and transmits the converted voltage to the last stage. Therefore, in the CMOS image sensor, the signal thereof is weaker than that of the CCD image sensor, and noise not only occurs regularly but also occurs due to a dark current. However, as a semiconductor processing technology develops, a CDS (Correlated Double Sampling) circuit is adopted to significantly reduce reset noise, so that an improved image signal can be obtained. In other words, the CDS circuit samples a reset voltage of an image pixel and then samples a signal voltage. At this time, an output of the CDS circuit equals the difference between the reset voltage and the signal voltage. Thus, the CDS circuit may reduce fixed pattern noises due to threshold voltage differences of the transistors in image pixels as well as the reset noises due to the reset voltage differences, thereby obtaining a higher resolution image. Therefore, the CMOS image sensor is widely used in a digital camera, a mobile phone, a PC camera, and the like. Further, the use of the CMOS image sensor is expanded to an automobile.

On the other hand, in order to implement such an image sensor used in an automobile, a number of requirements should be satisfied to obtain a high-resolution image. That is, a high signal-to-noise ratio (S/N), high quantum efficiency, a high fill factor, a high dynamic range and the like are should be satisfied.

FIG. 1 is a cross-sectional view illustrating a unit pixel 100 of a CMOS image sensor according to the related art, and FIG. 2 is a plan view illustrating a color filter array 110 according to the related art.

As shown in FIG. 1, the unit pixel 100 of the conventional CMOS image sensor is composed of a photodiode 120 which detects a light signal to convert into a current signal, an active pixel circuit 130 which converts the converted current signal into a voltage signal, and a color filter which transmits a light signal on the photodiode 120 and the active pixel circuit 130.

The active pixel array according to the related art is where the unit pixels are arranged. The active pixel array is composed of a pixel sensor array, a color filter array, and an insulating layer. The pixel sensor array is formed by repeatedly arranging a basic unit which is set to a 2×2 array structure composed of two pixel sensors, which detect a green light signal to convert into a voltage signal, and two pixel sensors which detect a red or blue light signal to convert into a voltage signal. The color filter array is formed on the pixel sensor array and is formed by repeatedly arranging a basic unit which is set to a 2×2 array structure composed of two filters, which transmit a green light signal, and two filters which transmit red and blue light signals. The insulating layer is formed between the pixel sensor array and the color filter array and on the color filter.

As shown in FIG. 2, the color filter array 110 is formed by repeatedly arranging a basic unit 200 which is set to a 2×2 array structure composed of first and third filers 200a and 200c which transmit a green light signal, a second filter 200b which transmits a red light signal, and a fourth filter 200d which transmits a blue light signal.

FIGS. 3A and 3B show an active pixel circuit 130 according to the related art. FIG. 3A shows a 3-transistor type active pixel circuit 130, and FIG. 3B shows a 4-transistor type active circuit 130.

As shown in FIG. 3A, the 3-transistor type active pixel circuit 130 is composed of a first switch 130a which changes the potential of a node by stored signal charges so as to change a bias, a second switch 130b which is connected the first switch 130a and receives a row select signal so as to output the voltage signal converted by the photodiode 120 to a column line, and a third switch 130c which receives a reset signal so as to reset the stored signal charges. The first to third switches 130a to 130c are composed of transistors.

As shown in FIG. 3B, the 4-transistor type active pixel circuit 130 is composed of a first switch 130a which changes the potential of a node by stored signal charges so as to change a bias, a second switch 130b which is connected to the first switch 130a and receives a row select signal so as to output the voltage signal converted by the photodiode 120 to a column line, a third switch 130c which receives a reset signal so as to reset the stored signal charges, and a fourth switch 130d which receives a transfer signal T so as to transfer the signal charges generated by the photodiode 120. The first to fourth switches 130a to 130d are composed of transistors.

The active pixel circuits 130 shown in FIGS. 3A and 3B respectively have an advantage. The 3-transistor type active pixel circuit 130 shown in FIG. 3A maintains a high fill factor because 3 transistors are used, but the noise performance is low. The 4-transistor type active pixel circuit 130 has more excellent noise performance than the 3-transistor type active pixel circuit 130, but maintains a low fill factor because four transistors are used.

FIG. 4 is a circuit diagram showing a basic unit 400 of the conventional pixel sensor array, which is constructed by using the 4-transistor type active pixel circuit.

As shown in FIG. 4, the basic unit of the conventional pixel sensor array is composed of first to fourth pixel sensors 400a to 400d. The first pixel sensor 400a is composed of a first photodiode 401 which detects a green light signal so as to generate a current signal and a first active pixel circuit 402 which converts the current signal into a voltage signal to output. The second pixel sensor 400b is composed of a second photodiode 403 which detects a red light signal so as to generate a current signal and a second active pixel circuit 404 which converts the current signal into a voltage signal to output. The third pixel sensor 400c is composed of a third photodiode 405 which detects a green light signal so as to generate a current signal and a third active pixel circuit 406 which converts the current signal into a voltage signal to output. The fourth pixel sensor 400d is composed of a fourth photodiode 407 which detects a blue light signal so as to generate a current signal and a fourth active pixel circuit 408 which converts the current signal into a voltage signal to output.

FIG. 5 is a block diagram showing a CMOS image sensor 500. As shown in FIG. 5, the CMOS image sensor 500 includes an active pixel sensor array 501 which is formed by repeatedly arranging the basic unit 400 of the pixel sensor array shown in FIG. 4, a control register 502, a timing and control circuit 503 which control timing and various signals, an analog signal processing section 505 which adjusts an analog signal, and an analog-digital converter 504 which converts an analog signal to a digital signal.

The active pixel sensor array 501 output an analog signal on an image, the analog signal processing section 505 corrects and adjusts the analog signal, and the analog-digital converter converts the analog signal into a digital signal. Then, the digital signal is transmitted to an image signal processor (ISP).

Recently, a light receiving area is narrowed as the pixel size is reduced in accordance with high density. Therefore, an influence of noise increases more and more, so that a signal-to-noise ratio (S/N) and performance of dynamic range are deteriorated.

As a light receiving area is reduced more and more, high resolution cannot be maintained in the related art where only one color is output from one pixel.

SUMMARY OF THE INVENTION

An advantage of the present invention is that it provides an active pixel array of a CMOS image sensor, in which a color filter array including a filter which transmits all wavelengths of light signals and a double PN junction photodiode are used to simultaneously detect two kinds of light signals, of which the wavelengths are different from each other, in one pixel and to secure a wide light receiving area, so that high resolution, a high signal-to-noise ratio (S/N), and an improved dynamic range can be expected.

Additional aspects and advantages of the present general inventive concept will be set forth in part in the description which follows and, in part, will be obvious from the description, or may be learned by practice of the general inventive concept.

According to an aspect of the invention, an active pixel array of a CMOS image sensor includes a pixel sensor array in which a pixel sensor which detects first and second light signals, of which the wavelengths are different from each other, among all wavelengths of light signals so as to generate current and voltage signals and a pixel sensor which detects a third light signal with a predetermined wavelength so as to generate a current or voltage signal are alternately arranged; and a color filter array that is formed on the pixel sensor array and in which a filter which transmits all wavelengths of light signals and a filter which transmits the third signal with a predetermined wavelength are alternately arranged.

The color filter array is formed by repeatedly arranging a basic unit composed of first and third filters which transmit all the wavelengths of light signals and second and fourth filters which transmit the third light signal.

According to another aspect of the invention, the pixel sensor array includes a first pixel sensor that is composed of a first photoelectric conversion section, which detects the first and second light signals so as to generate a current signal, and first and second active pixel circuits which convert the generated current signal into a voltage signal to output; a second pixel sensor that is composed of a second photoelectric conversion section, which detects the third signal so as to generate a current signal, and a third active pixel circuit which converts the generated current signal into a voltage signal to output; a third pixel sensor that is composed of a third photoelectric conversion section, which detects the first and second light signals so as to generate a current signal, and fourth and fifth active pixel circuits which converts the generated current signal into a voltage signal to output; and a fourth pixel sensor that is composed of a fourth photoelectric conversion section, which detects the third light signal so as to generate a current signal, and a sixth active pixel circuit which converts the generated current signal into a voltage signal to output. The pixel sensor array is formed by repeatedly arranging a basic unit composed of the first to fourth pixel sensors.

The first and second photoelectric conversion sections are respectively composed of first to third photodiodes and fourth to sixth photodiodes, which are double PN junction photodiodes, and the third and fourth photoelectric conversion sections are respectively composed of seventh to ninth photodiodes and tenth to twelfth photodiodes, which are double PN junction photodiodes.

The first and seventh photodiodes detect the first light signal, the second, third, eighth, and ninth photodiodes detect the second light signal, and the fourth to sixth photodiodes and the tenth to twelfth photodiodes detect the third light signal.

The anode terminal of the first photodiode is connected to a ground terminal, the cathode terminal thereof is connected to a first node, the anode terminals of the second and third photodiodes are connected to a ground terminal, and the cathode terminals thereof are connected to a second node.

The anode terminal of the fourth photodiode is connected to a ground terminal, the cathode thereof is connected to a fifth node, the anode terminals of the fifth and sixth photodiodes are connected to a ground terminal, and the cathode terminals thereof are connected to a sixth node.

The anode terminal of the seventh photodiode is connected to a ground terminal, the cathode thereof is connected to a ninth node, the anode terminals of the eighth and ninth photodiodes are connected to a ground terminal, and the cathode terminals thereof are connected to a tenth node.

The anode terminal of the tenth photodiode is connected to a ground terminal, the cathode terminal thereof is connected to a thirteenth node, the anode terminals of the eleventh and twelfth photodiodes are connected to a ground terminal, and the cathode terminals thereof are connected to a fourteenth node.

The first active pixel circuit includes a first switch that is connected to a third node, a power supply terminal, and the first node and changes the potential of the node connected to the first node by the signal charges stored in the first node so as to change the bias of the third node; a second switch that is connected to the first switch and receives a first row signal so as to output the voltage signal converted by the first photodiode to a first column line; and a third switch that is connected to the first node and a power supply terminal and receives a reset signal so as to reset the signal charges stored in the first node.

The second active pixel circuit includes a fourth switch that is connected to a fourth node, a power supply terminal, and the second node and changes the potential of the node connected to the second node by the signal charges stored in the second node so as to change the bias of the fourth node; a fifth switch that is connected to the fourth switch and receives a second row signal so as to output the voltage signal converted by the second and third photodiodes to the first column line; and a sixth switch that is connected to the second node and a power supply terminal and receives a reset signal so as to reset the signal charges stored in the second node.

The third active pixel circuit includes a seventh switch that is connected to an eighth node, a power supply terminal, and a seventh node and changes the potential of the node connected to the seventh node by the signal charges stored in the seventh node so as to change the bias of the eighth node; an eighth switch that is connected to the seventh switch and receives the first row signal so as to output the voltage signal converted by the fourth to sixth photodiodes to a fourth column line; and a ninth switch that is connected to the seventh node and a power supply terminal and receives a reset signal so as to reset the signal charges stored in the seventh node.

The fourth active pixel circuit includes a tenth switch that is connected to an eleventh node, a power supply terminal, and the ninth node and changes the potential of the node connected to the ninth node by the signal charges stored in the ninth node so as to change the bias of the eleventh node; an eleventh switch that is connected to the tenth switch and receives a third row signal so as to output the voltage signal converted by the seventh photodiode to a third column line; and a twelfth switch that is connected to the ninth node and a power supply terminal and receives a reset signal so as to reset the signal charges stored in the ninth node.

The fifth active pixel circuit includes a thirteenth switch that is connected to a twelfth node, a power supply terminal, and the tenth node and changes the potential of the node connected to the tenth node by the signal charges stored in the tenth node so as to change the bias of the twelfth node; a fourteenth switch that is connected to the thirteenth switch and receives a fourth row signal so as to output the voltage signal converted by the eighth and ninth photodiodes to the third column line; and a fifteenth switch that is connected to the tenth node and a power supply terminal and receives a reset signal so as to reset the signal charges stored in the tenth node.

The sixth active pixel circuit includes a sixteenth switch that is connected to a sixteenth node, a power supply terminal, and a fifteenth node and changes the potential of the node connected to the fifteenth node by the signal charges stored in the fifteenth node so as to change the bias of the sixteenth node; a seventeenth switch that is connected to the sixteenth switch and receives the third row signal so as to output the voltage signal converted by the tenth to twelfth photodiodes to the second column line; and an eighteenth switch that is connected to the fifteenth node and a power supply terminal and receives a reset signal so as to reset the signal charges stored in the fifteenth node.

The first to fourth row signals are sequentially applied.

The active pixel array further includes nineteenth to 24th switches that are respectively connected to the first, second, seventh, ninth, tenth, and fifteenth nodes of the first to sixth active pixel circuits and receive transfer signals so as to transfer the signal charges generated by the first to twelfth photodiodes.

The first to 24th switches are transistors.

According to a further aspect of the invention, the pixel sensor array includes a first pixel sensor that is composed of a first photoelectric conversion section, which detects the first and second light signals so as to generate a current signal, and a first active pixel circuit which converts the current signal into a voltage signal to output; a second pixel sensor that is composed of a second photoelectric conversion section, which detects the third light signal so as to generate a current signal, and a second active pixel circuit which converts the current signal into a voltage signal to output; a third pixel sensor that is composed of a third photoelectric conversion section, which detects the first and second light signals so as to generate a current signal, and a third active pixel circuit which converts the current signal into a voltage signal to output; and a fourth pixel sensor that is composed of a fourth photoelectric conversion section, which detects the third light signal so as to generate a current signal, and a fourth active pixel circuit which converts the current signal into a voltage signal to output. The pixel sensor array is formed by repeatedly arranging a basic unit composed of the first to fourth pixel sensors.

The first and second photoelectric conversion sections are respectively composed of first to third photodiodes and fourth to sixth photodiodes, which are double PN junction photodiodes, and the third and fourth photoelectric conversion sections are respectively composed of seventh to ninth photodiodes and tenth to twelfth photodiodes, which are double PN junction photodiodes.

The first and seventh photodiodes detect the first light signal, the second, third, eighth, and ninth photodiodes detect the second light signal, and the fourth to sixth photodiodes and the tenth to twelfth photodiodes detect the third light signal.

The anode terminal of the first photodiode is connected to a ground terminal, the cathode terminal thereof is connected to a first node, the anode terminals of the second and third photodiodes are connected to a ground terminal, and the cathode terminals thereof are connected to a second node.

The anode terminal of the fourth photodiode is connected to a ground terminal, the cathode thereof is connected to a fourth node, the anode terminals of the fifth and sixth photodiodes are connected to a ground terminal, and the cathode terminals thereof are connected to a fifth node.

The anode terminal of the seventh photodiode is connected to a ground terminal, the cathode thereof is connected to the first node, the anode terminals of the eighth and ninth photodiodes are connected to a ground terminal, and the cathode terminals thereof are connected to the second node.

The anode terminal of the tenth photodiode is connected to a ground terminal, the cathode terminal thereof is connected to a ninth node, the anode terminals of the eleventh and twelfth photodiodes are connected to a ground terminal, and the cathode terminals thereof are connected to a tenth node.

The first active pixel circuit includes a first switch that is connected to a third node, a power supply terminal, and the first node and changes the potential of the node connected to the first node by the signal charges stored in the first node so as to change the bias of the third node; a second switch that is connected to the first switch and receives a first row signal so as to output the voltage signal converted by the first and seventh photodiodes to a first column line; and a third switch that is connected to the first node and a power supply terminal and receives a reset signal so as to reset the signal charges stored in the first node.

The second active pixel circuit includes a fourth switch that is connected to a seventh node, a power supply terminal, and a sixth node and changes the potential of the node connected to the sixth node by the signal charges stored in the sixth node so as to change the bias of the seventh node; a fifth switch that is connected to the fourth switch and receives the first row signal so as to output the voltage signal converted by the fourth to sixth photodiodes to a fourth column line; and a sixth switch that is connected to the sixth node and a power supply terminal and receives a reset signal so as to reset the signal charges stored in the sixth node.

The third active pixel circuit includes a seventh switch that is connected to an eighth node, a power supply terminal, the second node and changes the potential of the node connected to the second node by the signal charges stored in the second node so as to change the bias of the eighth node; an eighth switch that is connected to the seventh switch and receives a second row signal so as to output the voltage signal converted by the second, third, eighth, and ninth photodiodes to a third column line; and a ninth switch that is connected to the second node and a power supply terminal and receives a reset signal so as to reset the signal charges stored in the second node.

The fourth active pixel circuit includes a tenth switch that is connected to a twelfth node, a power supply terminal, an eleventh node and changes the potential of the node connected to the eleventh node by the signal charges stored in the eleventh node so as to change the bias of the twelfth node; an eleventh switch that is connected to the tenth switch and receives the second row signal so as to output the voltage signal converted by the tenth to twelfth photodiodes to a second column line; and a twelfth switch that is connected to the eleventh node and a power supply terminal and receives a reset signal so as to reset the signal charges stored in the eleventh node.

The first and second row signals are sequentially applied.

The active pixel array further includes thirteenth to sixteenth switches that are respectively connected to the first, second, sixth, eleventh nodes of the first to fourth active pixel circuits and receives transfer signals so as to transfer the signal charges generated by the first to twelfth photodiodes.

The first to sixteenth switches are transistors.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
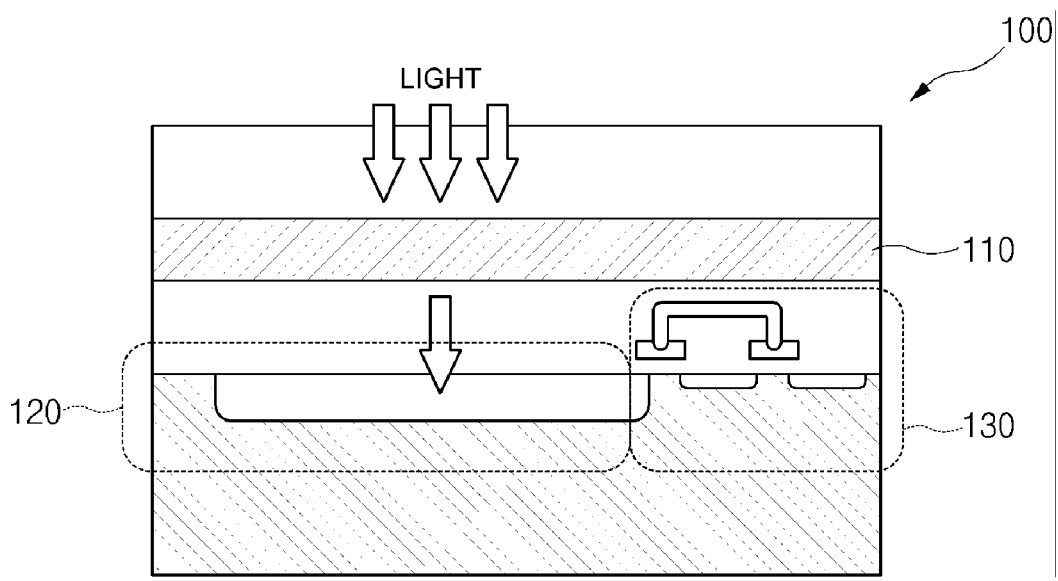
FIG. 1 is a cross-sectional view showing a unit pixel of a CMOS image sensor according to the related art.
Figure 2:
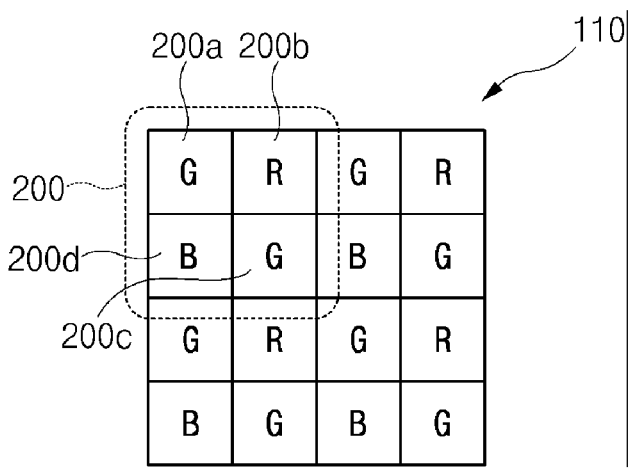
FIG. 2 is a plan view showing a color filter array according to the related art.
Figure 3A:
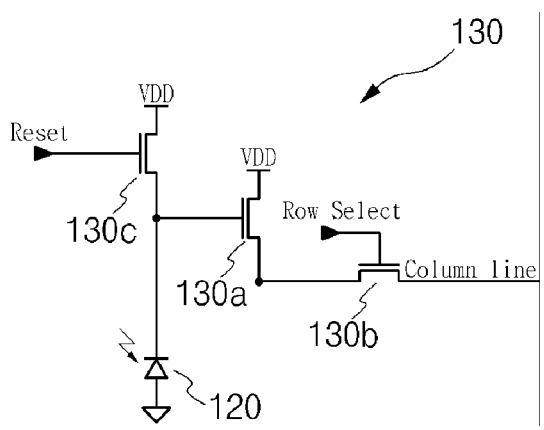
FIGS. 3A and 3B are circuit diagram showing an active pixel circuit according to the related art.
Figure 3B:
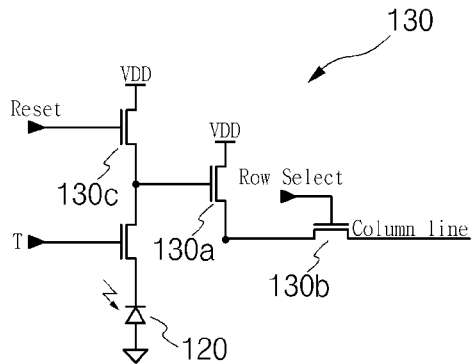
Figure 4:
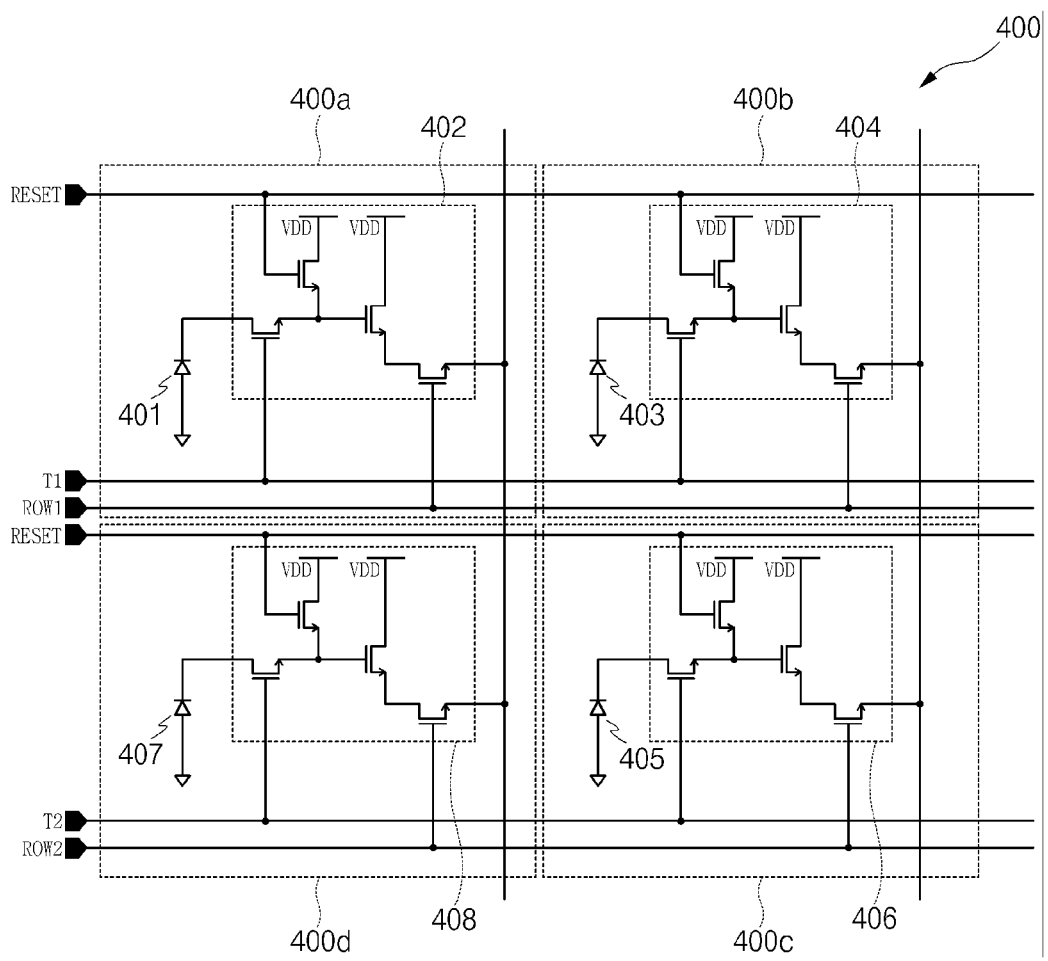
FIG. 4 is a circuit diagram showing a basic unit of a pixel sensor array according to the related art.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Hereinafter, preferred embodiments of the present invention will be described in detail with reference to the accompanying drawings.

First Embodiment

Figure 6A:
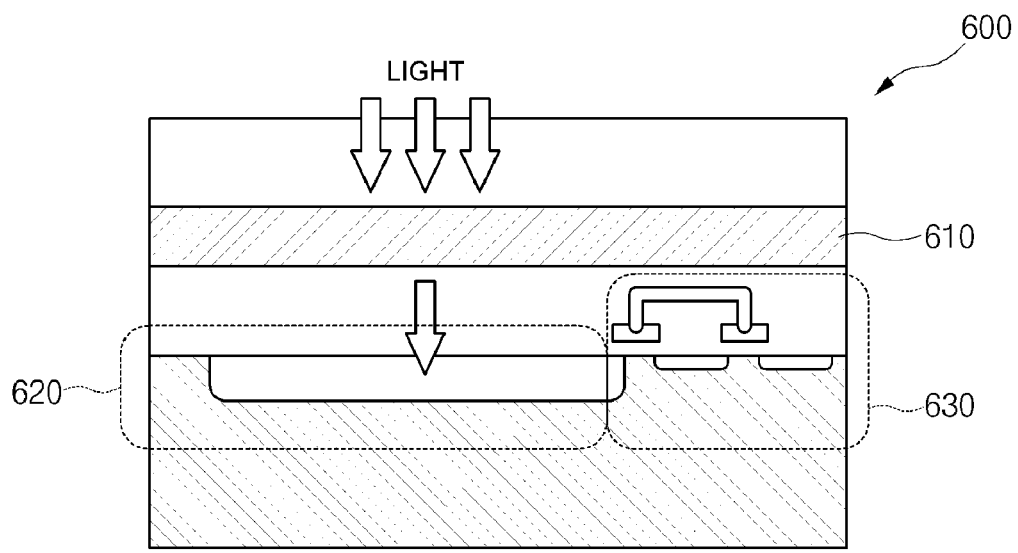
FIG. 6A is a cross-sectional view showing a unit pixel of the CMOS image sensor according to first and second embodiments of the present invention.
Figure 6B:
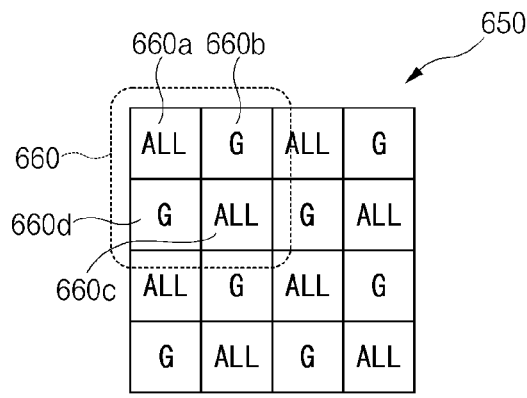
FIG. 6B is a plan view showing a color filter array according to the first and second embodiments of the invention.

FIG. 6A is a cross-sectional view showing a unit pixel 600 of a CMOS image sensor according to a first embodiment of the present invention, and FIG. 6B is a plan view showing a color filter array 650 according to the first embodiment of the invention.

As shown in FIG. 6A, the unit pixel 600 of the CMOS image sensor according to the first embodiment is composed of a photodiode 620 which detects a light signal to convert into a current signal, an active pixel circuit 630 which converts the converted current signal into a voltage signal, and a color filter 610 which transmits a light signal on the photodiode 620 and the active pixel array 630.

The photodiode 620 is a double PN junction photodiode which can detect light signals of which the wavelengths are different from each other. As the active pixel circuit 630, one or two active pixel circuits can be used per one pixel. As the color filter 610, such a filter that can transmit all wavelengths of light signals or a predetermined wavelength of light signal is used.

Accordingly, the active pixel array according to the first embodiment of the invention is where the above-described unit pixels are repeatedly arranged. The active pixel array is composed of a pixel sensor array and a color filter array. The pixel sensor array is where a pixel sensor which detects first and second light signals, of which the wavelengths are different, among all wavelengths of light signals so as to generate current and voltage signals and a pixel sensor which detects a third light signal with a predetermined wavelength so as to a current and voltage signal are alternately arranged. The color filer array, formed on the pixel sensor array, is where a filter which transmits all wavelengths of light signals and a filter which transmits a third light signal with a predetermined wavelength are alternately arranged.

As shown in FIG. 6B, the color filter array 650 is where a filter which transmits all wavelengths of light signals and a filter which transmits a third light signal with a predetermined wavelength are alternately arranged. The basic unit 660 of the color filter array 650 is set to a 2×2 array which is composed of first and third filters 660a and 660c which transmit all the wavelengths of light signals and second and fourth filters 660b and 660d which transmit the third light signal. The color filter array 650 is formed by repeatedly arranging the basic unit 660.

Figure 7A:
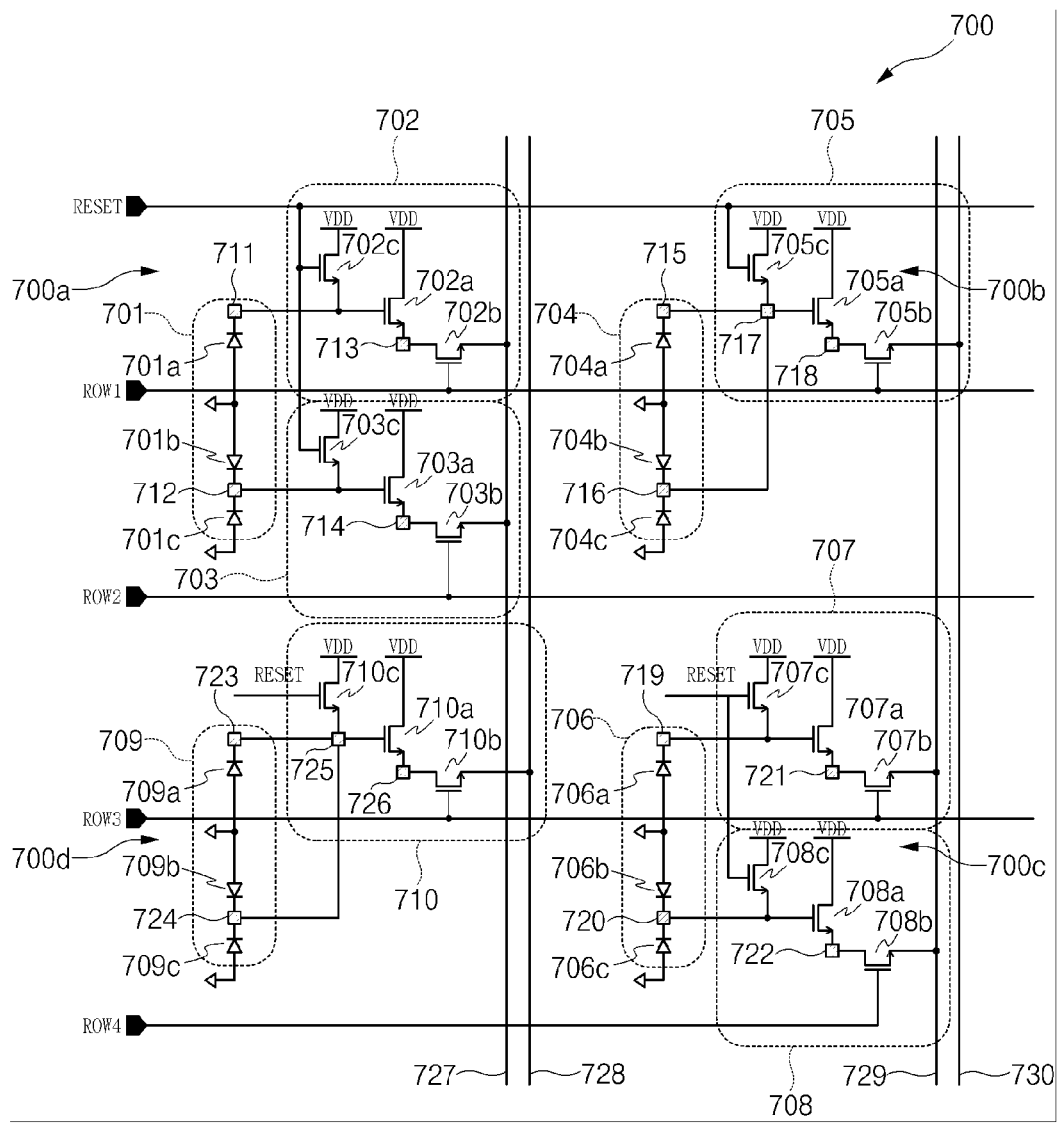
FIGS. 7A and 7B are circuit diagrams showing a basic unit of a pixel sensor array according to the first embodiment of the invention.
Figure 7B:
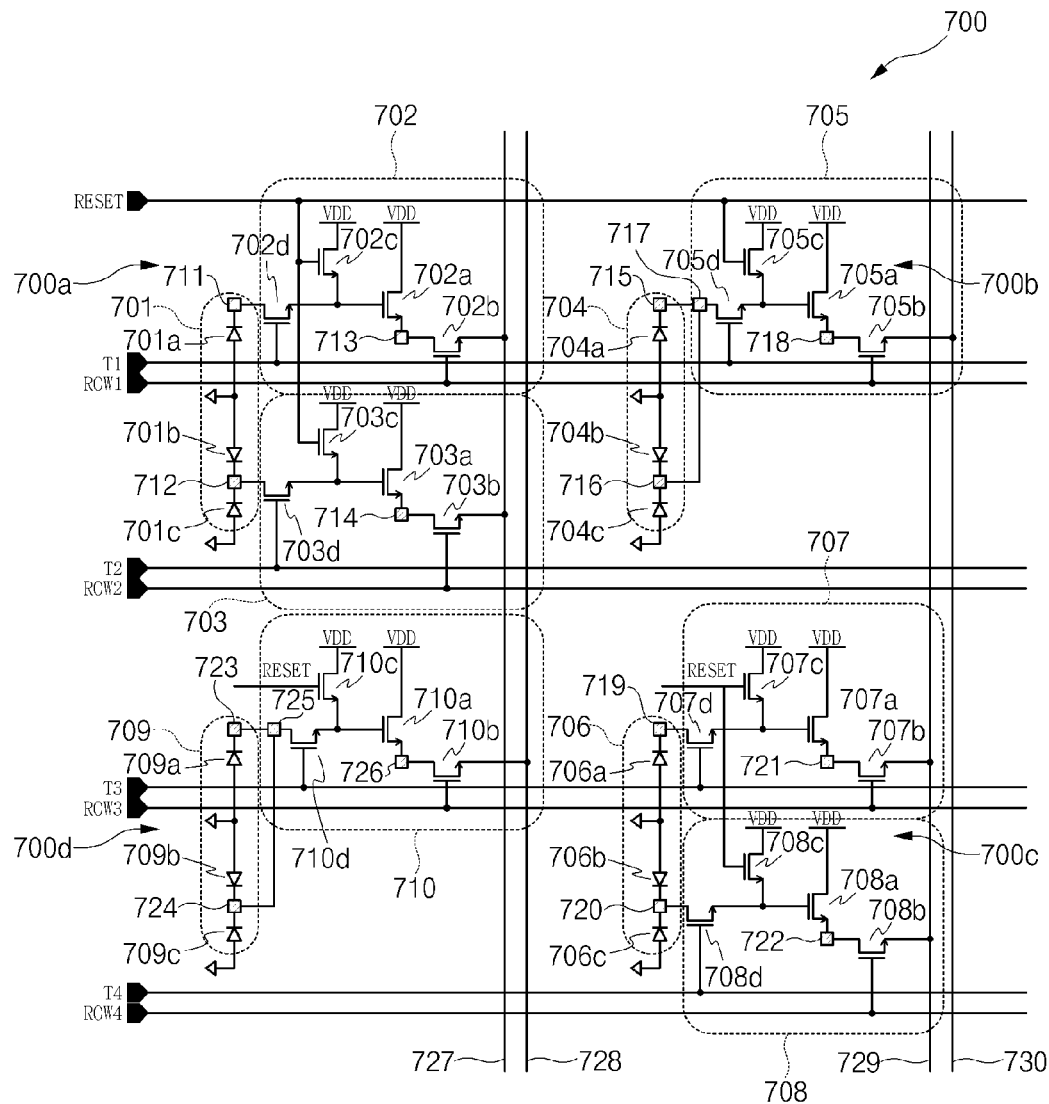

FIGS. 7A and 7B are circuit diagrams showing a basic unit of pixel sensor array 700 according to the first embodiment. FIG. 7A shows the pixel sensor array constructed by using a 3-transistor type active pixel circuit, and FIG. 7B shows the pixel sensor array constructed by using a 4-transistor type active pixel circuit.

As shown in FIG. 7A, the basic unit of the pixel sensor array 700 is composed of first to fourth pixel sensors 700a to 700d. The first pixel sensor 700a is composed of a first photoelectric conversion section 701, which detects the first and second light signals so as to generate a current signal, and first and second active pixel circuits 702 and 703 which convert the current signal into a voltage signal to output. The second pixel sensor 700b is composed of a second photoelectric conversion section 704, which detects the third light signal so as to generate a current signal, and a third active pixel circuit 705 which converts the current signal into a voltage signal to output. The third pixel sensor 700c is composed of a third photoelectric conversion section 706, which detects the first and second light signals so as to generate a current signal, and fourth and fifth active pixel circuits 707 and 708 which convert the current signal into a voltage signal to output. The fourth pixel sensor 700d is composed of a fourth photoelectric conversion section 709, which detects the third light signal so as to generate a current signal, and a sixth active pixel circuit 710 which converts the current signal into a voltage signal to output. The pixel sensor array 700 is formed by repeatedly arranging the basic unit which is set to a 2×2 array which is composed of the first to fourth pixel sensors 700a to 700d.

The first and second photoelectric conversion sections 701 and 704 are respectively composed of first to third photodiodes 701a to 701c and fourth to sixth photodiodes 704a to 704c, which are double PN junction photodiodes. The third and fourth photoelectric conversion sections 706 and 709 are respectively composed of seventh to ninth photodiodes 706a to 706c and tenth to twelfth photodiodes 709a to 709c, which are double PN junction photodiodes.

Since the first to twelfth photodiodes are double PN junction photodiodes, the first light signal of which the wavelength is the shortest among the first to third light signals can be detected by the first and seventh photodiodes 701a and 706a, the second light signal of which the wavelength is the longest can be detected by the second and third photodiodes 701b and 701c and the eighth and ninth photodiodes 706b and 706c, and the third light signal of which the wavelength is intermediate can be detected by the fourth to sixth photodiodes 704a to 704c and the tenth to twelfth photodiodes 709a to 709c.

The anode terminal of the first photodiode 701a is connected to a ground terminal, and the cathode terminal thereof is connected to a first node 711. The anode terminals of the second and third photodiodes 701b and 701c are connected to a ground terminal, and the cathode terminals thereof are connected to a second node 712.

The anode terminal of the fourth photodiode 704a is connected to a ground terminal, and the cathode terminal thereof is connected to a fifth node 715. The anode terminals of the fifth and sixth photodiodes 704b and 704c are connected to a ground terminal, and the cathode terminal thereof is connected to a sixth node 706.

The anode terminal of the seventh photodiode 706a is connected to a ground terminal, and the cathode terminal thereof is connected to a ninth node 719. The anode terminals of the eighth and ninth photodiodes 706b and 706c are connected to a ground terminal, and the cathode terminals thereof are connected to a tenth node 720.

The anode terminal of the tenth photodiode 709a is connected to a ground terminal, and the cathode terminal thereof is connected to a thirteenth node 723. The anode terminals of the eleventh and twelfth photodiodes 709b and 709c are connected to a ground terminal, and the cathode terminals thereof are connected to a fourteenth node 724.

The first active pixel circuit 702 is composed of a first switch 702a which is connected to a third node 713, a power supply terminal VDD, and the first node 711 and changes the potential of the node connected to the first node 711 by the signal charges stored in the first node 711 so as to change the bias of the third node 713, a second switch 702b which is connected to the first switch 702a and receives a first row signal ROW1 so as to output the voltage signal converted by the first photodiode 701a to a first column line 727, and a third switch 702c which is connected to the first node 711 and a power supply terminal VDD and receives a reset signal RESET so as to reset the signal charges stored in the first node. Through the first column line 727, the first light signal is output.

The second active pixel circuit 703 is composed of a fourth switch 703a which is connected to a fourth node 714, a power supply terminal VDD, and the second node 712 and changes the potential of the node connected to the second node 712 by the signal charges stored in the second node 712 so as to change the bias of the fourth node 714, a fifth switch 703b which is connected to the fourth switch 703a and receives a second row signal ROW2 so as to output the voltage signal converted by the second and third photodiodes 701b and 701c to the first column line 727, and a sixth switch 703c which is connected to the second node 712 and a power supply terminal VDD and receives a reset signal RESET so as to reset the signal charges stored in the second node 712. Through the first column line 727, the second light signal is output.

The third active pixel circuit 705 is composed of a seventh switch 705a which is connected to an eighth node 718, a power supply terminal VDD, and the seventh node 717 and changes the potential of the node connected to the seventh node 717 by the signal charges stored in the seventh node 717 so as to change the bias of the eighth node 718, an eighth switch 705b which is connected to the seventh switch 705a and receives the first row signal ROW1 so as to output the voltage signal converted by the fourth to sixth photodiodes 704a to 704c to a fourth column line 730, and a ninth switch 705c which is connected to the seventh node 717 and a power supply terminal VDD and receives a reset signal RESET so as to reset the signal charges stored in the seventh node 717. Through the fourth column line 730, the third light signal is output.

The fourth active pixel circuit 707 is composed of a tenth switch 707a which is connected to an eleventh node 721, a power supply terminal VDD, and the ninth node 719 and changes the potential of the node connected to the ninth node 719 by the signal charges stored in the ninth node 719 so as to change the bias of the eleventh node 721, an eleventh switch 707b which is connected to the tenth node 707a and receives a third row signal ROW3 so as to output the voltage signal converted by the seventh photodiode 706a to the third column line 729, and a twelfth switch 707c which is connected to the ninth node 719 and a power supply terminal VDD and receives a reset signal RESET so as to reset the signal charges stored in the ninth node 719. Through the third column line 729, the first light signal is output.

The fifth active pixel circuit 708 is composed of a thirteenth switch 708a which is connected to a twelfth node 722, a power supply terminal VDD, and the tenth node 720 and changes the potential of the node connected to the tenth node 720 by the signal charges stored in the tenth node 720 so as to change the bias of the twelfth node 722, a fourteenth switch 708b which is connected to the thirteenth switch 708a and receives a fourth row signal ROW4 so as to output the voltage signal converted by the eighth and ninth photodiodes 706b and 706c to the third column line 729, and a fifteenth switch 708c which is connected to the tenth node 720 and a power supply terminal VDD and receives a reset signal RESET so as to reset the signal charges stored in the tenth node 720. Through the third column line 729, the second light signal is output.

The sixth active pixel signal 710 is composed of a sixteenth switch 710a which is connected to a sixteenth node 726, a power supply terminal VDD, and a fifteenth node 725 and changes the potential of the node connected to the fifteenth node 725 by the signal charges stored in the fifteenth node 725 so as to change the bias of the sixteenth node 726, a seventeenth switch 710b which is connected to the sixteenth switch 710a and receives the third row signal ROW3 so as to output the voltage signal converted by the tenth to twelfth photodiodes 709a to 709c to the second column line 728, and an eighteenth switch 710c which is connected to the fifteenth node 725 and a power supply terminal VDD and receives a reset signal RESET so as to reset the signal charges stored in the fifteenth node 725. Through the second column line 728, the third light signal is output.

The first to eighteenth switches are composed of transistors, and the first to fourth row signals ROW1 to ROW4 are sequentially applied.

Accordingly, if the first row signal ROW1 is applied, the first light signal is output to the first column line 727 and the third light signal is output to the fourth column line 730.

If the second row signal ROW2 is applied, the second light signal is output to the first column line 727.

If the third row signal ROW3 is applied, the third light signal is output to the second column line 728 and the first light signal is output to the third column line 729.

Further, if the fourth row signal ROW4 is applied, the second light signal is output to the third column line 729. The signals output through the first to fourth column lines 727 to 730 are input to the analog signal processing section 505 such as a decoder and CDS (Correlated Double Sampling), shown in FIG. 5.

On the other hand, as shown in FIG. 7B, the basic unit of the pixel sensor array 700 constructed by using a 4-transistor type active pixel circuit is where nineteenth to 24th switches 702d, 703d, 705d, 707d, 708d, and 710d, which receive transfer signals T1 to T4 so as to transfer the signal charges generated by the first to twelfth photodiodes, are respectively connected to the first, second, seventh, ninth, tenth, and fifteenth nodes 711, 712, 717, 719, 720, and 725 of the first to sixth active pixel circuits 702, 703, 705, 707, 708, and 710. The nineteenth to 24th switches 702d, 703d, 705d, 707d, 708d, and 710d are also composed of transistors.

The basic unit of the pixel sensor array 700 of the first embodiment shown in FIGS. 7A and 7B can output six colors of light signals, while four colors of light signals are output in the related art. Therefore, high resolution, a high signal-to-noise ratio, and an improved dynamic range can be expected.

Second Embodiment

A unit pixel of a CMOS image sensor and a color filter array according to a second embodiment of the present invention are respectively the same as the unit pixel 600 of the CMOS image sensor and the color filter array 650 according to the first embodiment, shown in FIGS. 6A and 6B, except that one active pixel circuit is used per one pixel.

Figure 8A:
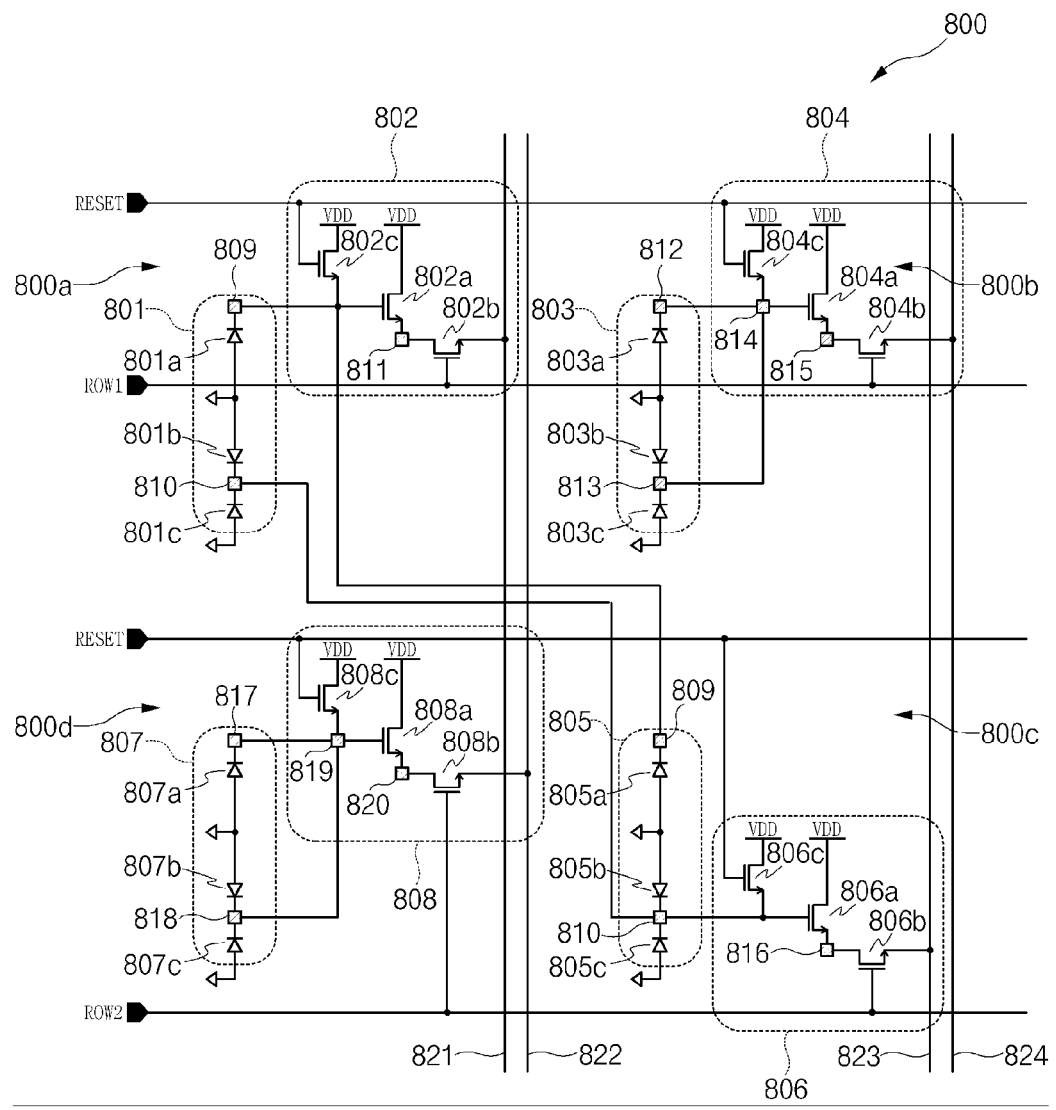
FIGS. 8A and 8B are circuit diagrams showing a basic unit of a pixel sensor array according to the second embodiment of the invention.
Figure 8B:
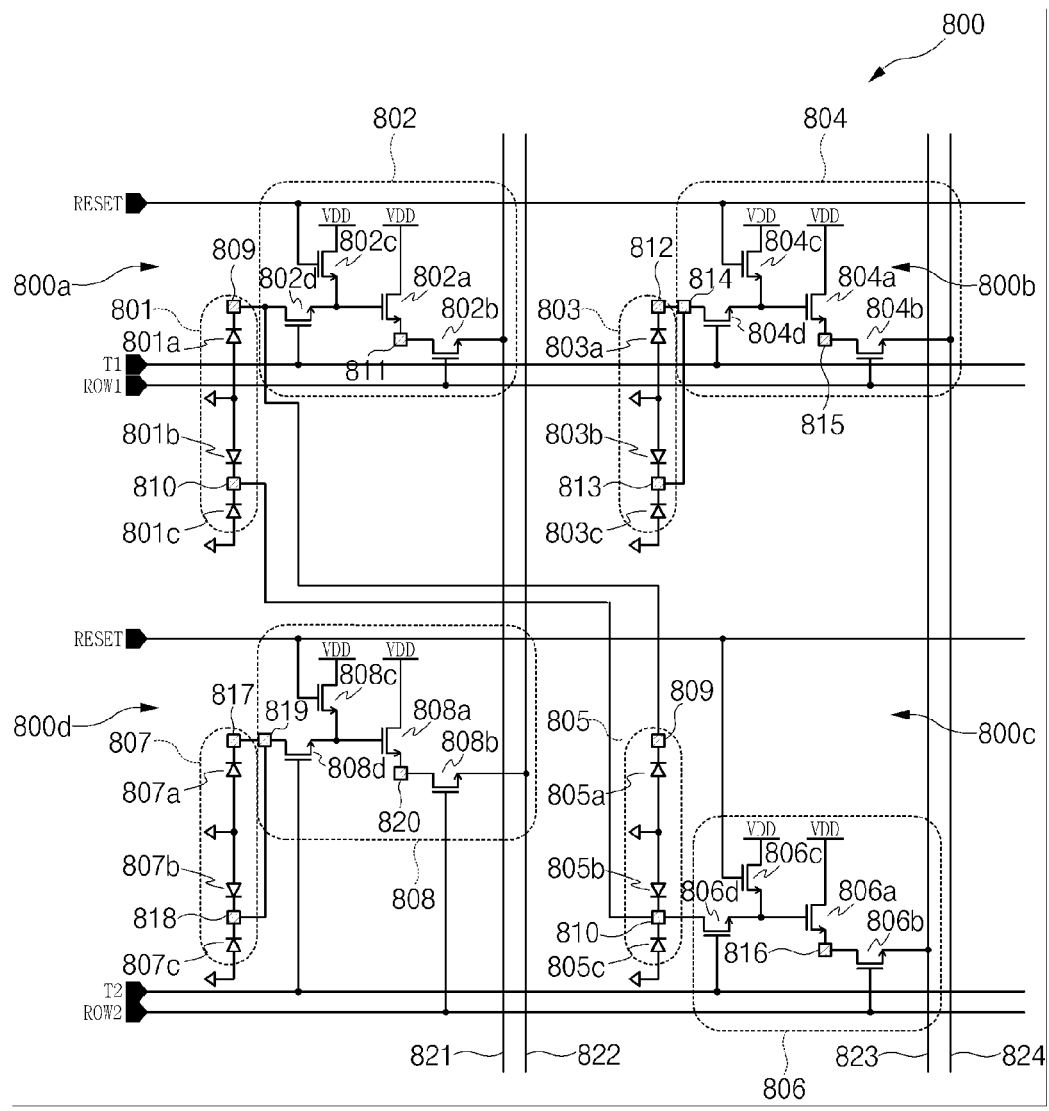

FIGS. 8A and 8B show the basic unit of a pixel sensor array 800 according to the second embodiment. As in the first embodiment, FIG. 8A shows a pixel sensor array constructed by using a 3-transistor type active pixel circuit, and FIG. 8B shows a pixel sensor array constructed by using a 4-transistor type active pixel circuit.

As shown in FIG. 8A, the basic unit of the pixel sensor array 800 is composed of first to fourth pixel sensors 800a to 800d. The first pixel sensor 800a is composed of a first photoelectric conversion section 801, which detects the first and second light signals so as to generate a current signal, and a first active pixel circuit 802 which converts the current signal to a voltage signal to output. The second pixel sensor 800b is composed of a second photoelectric conversion section 803, which detects the third light signal so as to generate a current signal, and a second active pixel circuit 804 which converts the current signal into a voltage signal to output. The third pixel sensor 800c is composed of a third photoelectric conversion section 805, which detects the first and second light signals so as to generate a current signal, and a third active pixel circuit 806 which converts the current signal into a voltage signal to output. The fourth pixel sensor 800d is composed of a fourth photoelectric conversion section 807, which detects the third light signal so as to generate a current signal, and a fourth active pixel circuit 808 which converts the current signal into a voltage signal to output. As in the first embodiment, the pixel sensor array 800 is formed by repeatedly arranging the basic unit which is set to a 2×2 array which is composed of the first to fourth pixel sensors 800a to 800d.

The first and second photoelectric conversion sections 801 and 803 are respectively composed of first to third photodiodes 801a to 801c and fourth to sixth photodiodes 803a to 803c, which are double PN junction photodiodes. The third and fourth photoelectric conversion sections 805 and 807 are respectively composed of seventh to ninth photodiodes 805a to 805c and tenth to twelfth photodiodes 807a to 807c.

Since the first to twelfth photodiodes are double PN junction photodiodes, the first light signal of which the wavelength is the shortest among the first to third light signals can be detected by the first and seventh photodiodes 801a and 805a, the second light signal of which the wavelength is the longest can be detected by the second and third photodiodes 801b and 801c and the eighth and ninth photodiodes 805b and 805c, and the third light signal of which the wavelength is intermediate can be detected by the fourth to sixth photodiodes 803a to 803c and the tenth to twelfth photodiodes 807a to 807c.

The anode terminal of the first photodiode 801a is connected to a ground terminal, and the cathode terminal thereof is connected to a first node 809. The anode terminals of the second and third photodiodes 801b and 801c are connected to a ground terminal, and the cathode terminals thereof are connected to a second node 810.

The anode terminal of the second photodiode 803a is connected to a ground terminal, and the cathode terminal thereof is connected to a fourth node 812. The anode terminals of the fifth and sixth photodiodes 803b and 803c are connected to a ground terminal, and the cathode terminals thereof are connected to a fifth node 813.

The anode terminal of the seventh photodiode 805a is connected to a ground terminal, and the cathode terminal thereof is connected to the first node 809. The anode terminals of the eighth and ninth photodiodes 805b and 805c are connected to a ground terminal, and the cathode terminals thereof are connected to the second node 810.

The anode terminal of the tenth photodiode 807a is connected to a ground terminal, and the cathode terminal thereof is connected to a ninth node 817. The anode terminals of the eleventh and twelfth photodiodes 807b and 807c are connected to a ground terminal, and the cathode terminals thereof are connected to a tenth node 818.

The first active pixel circuit 802 is composed of a first switch 802a which is connected to a third node 811, a power supply terminal VDD, and the first node 908 and changes the potential of the node connected to the first node 809 by the signal charges stored in the first node 809 so as to change the bias of the third node 811, a second switch 802b which is connected to the first switch 802a and receives a first row signal ROW1 so as to output the voltage signal converted by the first photodiode 801a to a first column line 821, and a third switch 802c which is connected to the first node 809 and a power supply terminal VDD and receives a reset signal RESET so as to reset signal charges stored in the first node 809. Through the first column line 821, the first light signal is output.

The second active pixel circuit 804 is composed of a fourth switch 804a which is connected to a seventh node 815, a power supply terminal VDD, and a sixth node 814 and changes the potential of the node connected to the sixth node 814 by the signal charges stored in the sixth node 814 so as to change the bias of the seventh node 815, and a fifth switch 804b which is connected to the fourth switch 804a and receives the first row signal ROW1 so as to output the voltage signal converted by the fourth to sixth photodiodes 803a to 803c to a fourth column line 824, and a sixth switch 804c which is connected to the sixth node 814 and a power supply terminal VDD and receives a reset signal RESET so as to reset the signal charges stored in the sixth node 814. Through the fourth column line 824, the third light signal is output.

The third active pixel circuit 806 is composed of a seventh switch 806a which is connected to an eighth node 816, a power supply terminal VDD, and the second node 810 and changes the potential of the node connected to the second node 810 by the signal charges stored in the second node 810 so as to change the bias of the eighth node 816, an eighth switch 806b which is connected to the seventh switch 806a and receives a second row signal ROW2 so as to output the voltage signals converted by the second, third, eighth, and ninth photodiodes 801b, 801c, 805b, and 805c to a third column line 823, and a ninth switch 806c which is connected to the second node 810 and a power supply terminal VDD and receives a reset signal RESET so as to reset the signal charges stored in the second node 810. Through the third column line 823, the second light signal is output.

The fourth active pixel circuit 808 is composed of a tenth switch 808a which is connected to a twelfth node 820, a power supply terminal VDD, and an eleventh node 819 and changes the potential of the node connected to the eleventh node 819 by the signal charges stored in the eleventh node 819 so as to change the bias of the twelfth node 820, an eleventh switch 808b which is connected to the tenth switch 808a and receives the second row signal ROW2 so as to output the voltage signals converted by the tenth to twelfth photodiodes 807a to 807c to the second column line 822, and a twelfth switch 808c which is connected to the eleventh node 819 and a power supply terminal VDD and receives a reset signal RESET so as to reset the signal charges stored in the eleventh node 819. Through the second column line 822, the third light signal is output.

The first to twelfth switches are composed of transistors, and the first and second row signals ROW1 and ROW2 are sequentially applied.

Accordingly, if the first row signal ROW1 is applied, the first light signal is output to the first column line 821, and the third light signal is output to the fourth column line 824.

If the second row signal ROW2 is applied, the third light signal is output to the second column line 822, and the second light signal is output to the third column line 823.

Figure 5:
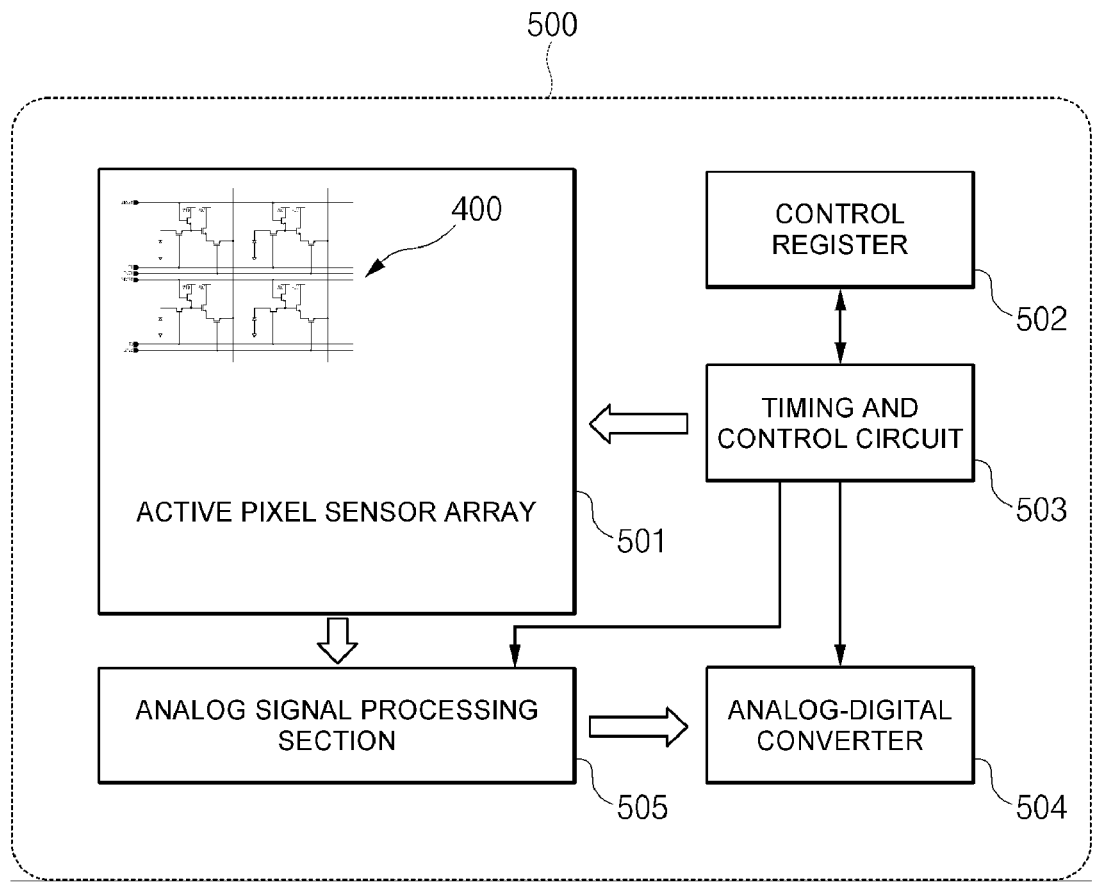
FIG. 5 is a block diagram showing a CMOS image sensor.

The signals output through the first to fourth column lines 821 to 824 are input into the analog signal processing section 505 such as a decoder and CDS shown in FIG. 5.

On the other hand, as shown in FIG. 8B, the basic unit of the pixel sensor array 800 constructed by using a 4-transistor type active pixel circuit is where thirteenth to sixteenth switches 802d, 804d, 806d, and 808d, which receive transfer signals T1 and T2 so as to transfer the signal charges generated by the first to twelfth photodiodes, are respectively connected to the first, second, sixth, and eleventh nodes of the first to fourth active pixel circuits 802, 804, 806, and 808. The thirteenth to sixteenth switches 802d, 804d, 806d, and 808d are also composed of transistors.

The basic unit of the pixel sensor array 800 of the second embodiment shown in FIGS. 8A and 8B synthesizes the first and second light signals, which can be output by the first and third pixel sensors of the first embodiment, so as to output the first light signal through the first column line and to output the second light signal through the third column line 283. Therefore, a higher signal-to-noise ratio and fill factor can be obtained.

In the active pixel array of the CMOS image sensor according to the present invention, the color filter array including a filter which transmits all wavelengths of light signals and the double PN junction photodiodes are used, so that two kinds of light signals of which the wavelengths are different from each other can be simultaneously detected in one pixel. Accordingly, high resolution, a high signal-to-noise ratio (S/N), and an improved dynamic range can be expected.

As two light signals with a different wavelength can be synthesized into one signal, a wider light receiving area can be secured. Accordingly, a high fill factor can be maintained even though the pixel size is reduced.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An active pixel array of a CMOS image sensor comprising:
   a pixel sensor array that includes a first pixel sensor configured to detect first and second light signals, of which the wavelengths are different from each other, among all wavelengths of light signals so as to generate current and voltage signals; and
   a second pixel sensor configured to detect a third light signal with a predetermined wavelength so as to generate a current or voltage signal are alternately arranged; and a color filter array that is formed on the pixel sensor array and in which a filter which transmits all wavelengths of light signals and a filter which transmits the third signal with a predetermined wavelength are alternately arranged;

wherein the color filter array is formed by repeatedly arranging a basic unit composed of first and third filters which transmit all the wavelengths of light signals and second and fourth filters which transmit the third light signal;

wherein:

the first pixel sensor comprises a first photoelectric conversion section, which detects the first and second light signals so as to generate a current signal, and first and second active pixel circuits which convert the generated current signal into a voltage signal to output;

the second pixel sensor comprises a second photoelectric conversion section, which detects the third signal so as to generate a current signal, and a third active pixel circuit configured to convert the generated current signal into a voltage signal to output;

a third pixel sensor that includes a third photoelectric conversion section configured to detect the first and second light signals so as to generate a current signal, and fourth and fifth active pixel circuits configured to convert the generated current signal into a voltage signal to output; and a fourth pixel sensor that includes a fourth photoelectric conversion section configured to detect the third light signal so as to generate a current signal, and a sixth active pixel circuit configured to convert the generated current signal into a voltage signal to output, and wherein the pixel sensor array is formed by repeatedly arranging a basic unit composed of the first to fourth pixel sensors.

2. The active pixel array of a CMOS image sensor according to claim 1, wherein the first and second photoelectric conversion sections are respectively composed of first to third photodiodes and fourth to sixth photodiodes, which are double PN junction photodiodes, and the third and fourth photoelectric conversion sections are respectively composed of seventh to ninth photodiodes and tenth to twelfth photodiodes, which are double PN junction photodiodes.

3. The active pixel array of a CMOS image sensor according to claim 2, wherein the first and seventh photodiodes detect the first light signal, the second, third, eighth, and ninth photodiodes detect the second light signal, and the fourth to sixth photodiodes and the tenth to twelfth photodiodes detect the third light signal.

4. The active pixel array of a CMOS image sensor according to claim 3, wherein the anode terminal of the first photodiode is connected to a ground terminal, the cathode terminal thereof is connected to a first node, the anode terminals of the second and third photodiodes are connected to a ground terminal, and the cathode terminals thereof are connected to a second node.

5. The active pixel array of a CMOS image sensor according to claim 4, wherein the anode terminal of the fourth photodiode is connected to a ground terminal, the cathode thereof is connected to a fifth node, the anode terminals of the fifth and sixth photodiodes are connected to a ground terminal, and the cathode terminals thereof are connected to a sixth node.

6. The active pixel array of a CMOS image sensor according to claim 5, wherein the anode terminal of the seventh photodiode is connected to a ground terminal, the cathode thereof is connected to a ninth node, the anode terminals of the eighth and ninth photodiodes are connected to a ground terminal, and the cathode terminals thereof are connected to a tenth node.

7. The active pixel array of a CMOS image sensor according to claim 6, wherein the anode terminal of the tenth photodiode is connected to a ground terminal, the cathode terminal thereof is connected to a thirteenth node, the anode terminals of the eleventh and twelfth photodiodes are connected to a ground terminal, and the cathode terminals thereof are connected to a fourteenth node.

8. The active pixel array of a CMOS image sensor according to claim 7, wherein the first active pixel circuit includes:

a first switch that is connected to a third node, a power supply terminal, and the first node and changes the potential of the node connected to the first node by the signal charges stored in the first node so as to change the bias of the third node;

a second switch that is connected to the first switch and receives a first row signal so as to output the voltage signal converted by the first photodiode to a first column line; and a third switch that is connected to the first node and a power supply terminal and receives a reset signal so as to reset the signal charges stored in the first node.

9. The active pixel array of a CMOS image sensor according to claim 8, wherein the second active pixel circuit includes:

a fourth switch that is connected to a fourth node, a power supply terminal, and the second node and changes the potential of the node connected to the second node by the signal charges stored in the second node so as to change the bias of the fourth node;

a fifth switch that is connected to the fourth switch and receives a second row signal so as to output the voltage signal converted by the second and third photodiodes to the first column line; and a sixth switch that is connected to the second node and a power supply terminal and receives a reset signal so as to reset the signal charges stored in the second node.

10. The active pixel array of a CMOS image sensor according to claim 9, wherein the third active pixel circuit includes:

a seventh switch that is connected to an eighth node, a power supply terminal, and a seventh node and changes the potential of the node connected to the seventh node by the signal charges stored in the seventh node so as to change the bias of the eighth node;

an eighth switch that is connected to the seventh switch and receives the first row signal so as to output the voltage signal converted by the fourth to sixth photodiodes to a fourth column line; and a ninth switch that is connected to the seventh node and a power supply terminal and receives a reset signal so as to reset the signal charges stored in the seventh node.

11. The active pixel array of a CMOS image sensor according to claim 10,
wherein the fourth active pixel circuit includes:
a tenth switch that is connected to an eleventh node, a power supply terminal, and the ninth node and changes the potential of the node connected to the ninth node by the signal charges stored in the ninth node so as to change the bias of the eleventh node;
an eleventh switch that is connected to the tenth switch and receives a third row signal so as to output the voltage signal converted by the seventh photodiode to a third column line; and
a twelfth switch that is connected to the ninth node and a power supply terminal and receives a reset signal so as to reset the signal charges stored in the ninth node.

12. The active pixel array of a CMOS image sensor according to claim 11,
wherein the fifth active pixel circuit includes:
a thirteenth switch that is connected to a twelfth node, a power supply terminal, and the tenth node and changes the potential of the node connected to the tenth node by the signal charges stored in the tenth node so as to change the bias of the twelfth node;
a fourteenth switch that is connected to the thirteenth switch and receives a fourth row signal so as to output the voltage signal converted by the eighth and ninth photodiodes to the third column line; and
a fifteenth switch that is connected to the tenth node and a power supply terminal and receives a reset signal so as to reset the signal charges stored in the tenth node.

13. The active pixel array of a CMOS image sensor according to claim 12,
wherein the sixth active pixel circuit includes:
a sixteenth switch that is connected to a sixteenth node, a power supply terminal, and a fifteenth node and changes the potential of the node connected to the fifteenth node by the signal charges stored in the fifteenth node so as to change the bias of the sixteenth node;
a seventeenth switch that is connected to the sixteenth switch and receives the third row signal so as to output the voltage signal converted by the tenth to twelfth photodiodes to the second column line; and
an eighteenth switch that is connected to the fifteenth node and a power supply terminal and receives a reset signal so as to reset the signal charges stored in the fifteenth node.

14. The active pixel array of a CMOS image sensor according to claim 13,
wherein the first to fourth row signals are sequentially applied.

15. The active pixel array of a CMOS image sensor according to claim 14 further including nineteenth to 24th switches that are respectively connected to the first, second, seventh, ninth, tenth, and fifteenth nodes of the first to sixth active pixel circuits and receive transfer signals so as to transfer the signal charges generated by the first to twelfth photodiodes.

16. The active pixel array of a CMOS image sensor according to claim 15, wherein the first to 24th switches are transistors.

* * * * *